July 2, 1968 J. T. PIERCE 3,391,024

PROCESS FOR PREPARING IMPROVED CRYOGENIC CIRCUITS

Filed Nov. 16, 1964

INVENTOR
JOE T. PIERCE

E. Mickey Hubbard
ATTORNEY

United States Patent Office 3,391,024

Patented July 2, 1968

3,391,024

PROCESS FOR PREPARING IMPROVED CRYOGENIC CIRCUITS

Joe T. Pierce, Richardson, Tex., assignor to Texas Instruments Incorporated, Dallas, Tex., a corporation of Delaware Filed Nov. 16, 1964, Ser. No. 411,253

2 Claims. (Cl. 117—217)

ABSTRACT OF THE DISCLOSURE

Disclosed is a process for bonding a superconductive metal film to a substrate by a thin film of an alloy comprising from about 30 percent to about 70 percent by weight tin (Sn) and the remainder indium (In).

The present invention relates to cryogenic circuits, and more specifically, but not by way of limitation, relates to a process for improving the adherence of a superconductive film such as lead to a substrate, and to the improved cryogenic circuit device resulting therefrom.

In general, cryogenic circuits may be considered as those circuits which are operated at such a low temperature that metal becomes superconductive and exhibits no resistance until the current flowing therein exceeds a critical limit, at which point the metal abruptly reverts to normal resistivity. Different metals have different critical current levels for a particular temperature and for a particular magnetic field strength in which the metal is positioned. A cryotron utilizes this phenomenon to provide a means for switching a particular carrier conductor from superconductivity to normal resistivity.

A cryotron is formed by a metal control conductor having a relatively high critical current for a given temperature, positioned in close proximity to a metal gate conductor having a relatively low critical current at the same temperature. A current in the control conductor below the critical level of that conductor will nevertheless create a magnetic field adjacent the carrier conductor sufficient to switch the carrier conductor from superconductivity to normal resistivity so that a free cycling current, for example, in the carrier conductor may be abruptly stopped.

In copending U.S. application S.N. 339,018 entitled "Process for Manufacturing Multilayer Film Circuits," filed Jan. 20, 1964, by Pierce et al., and assigned to the assignee of the present invention, a process for manufacturing thin film circuits in general, and cryogenic circuits in particular, was described. In that process, cryotrons are made by first forming conductor strips of one type of metal, such as tin, on a substrate, covering the substrate and tin strips with an insulating material having windows over portions of the tin strips, and then depositing a second metal film over the insulating material so that it passes through the windows and makes contact with the first deposited metal strips. The second metal film is then patterned to produce superconductive strips comprised of portions of the second film and the tin strips. In such a circuit, difficulty is sometimes experienced in that the lead films do not always uniformly adhere to the glass substrate, to the previously deposited metal films, or to the insulating material, and this of course results in a useless circuit.

The present invention is concerned with a process for improving the adherence of the superconductive metal films, particularly lead, to the substrate, including any preceding films or coating over which it may be deposited. This must be accomplished without interfering with the critical current levels or the superconductivity of the respective conductors. The attainment of this goal is complicated by the fact that a superconductor having a low critical current level placed in contact with a conductor having a higher critical current will reduce the critical current level of the second conductor. Also, in the fabrication process described above, care must be taken not to contaminate the junction formed between successive layers through the windows in the insulation or the superconductivity of the resulting conductor will be adversely affected. Further, the process of fabricating the cryotrons should not be materially complicated by the requirement to improve adherence, and should preferably be susceptible to being carried out in a vacuum chamber at low temperature without the requirement of breaking the vacuum seal prior to deposition of the respective film.

These and other requirements are met by the process of the present invention wherein a superconductive metal film is bonded to a substrate by a thin film of an alloy comprised of from about 30% to about 70% tin (Sn) by weight and the remainder indium (In). More specifically, the alloy film is evaporated in a vacuum chamber and nucleated on the substrate immediately prior to evaporation and deposition of a lead film. The resulting cryogenic circuit has improved mechanical stability, yet the superconductive characteristics of the circuit are not materially affected either by the intimate contact with the thin film of alloy or by reason of the junction between the tin and lead including some of the alloy, because the critical current level of the alloy is approximately equal to the critical current level of lead.

Additional aspects, objects and advantages of the invention are set forth in and will be evident from the following detailed description and drawings, wherein.

Figure 1:
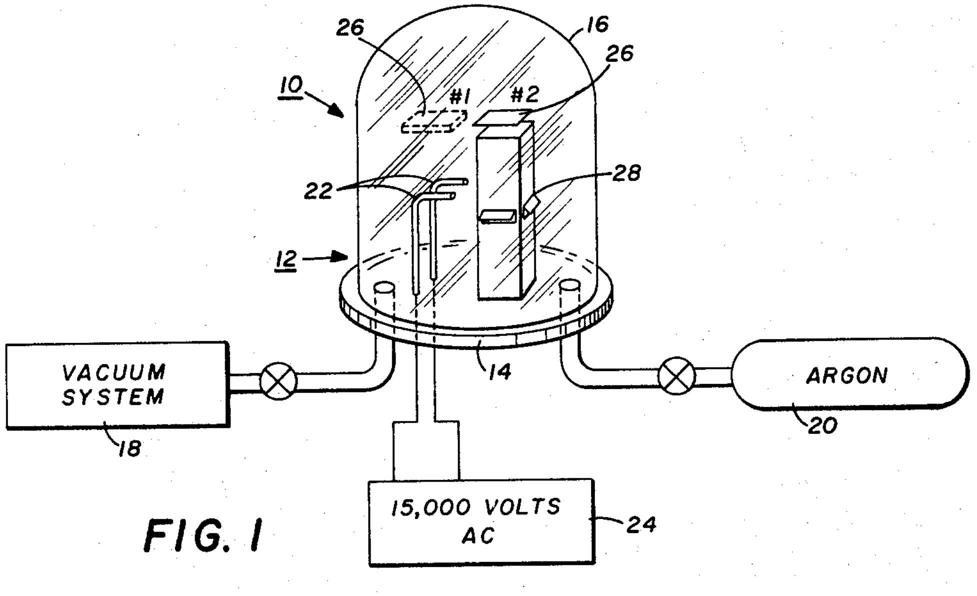
FIGURE 1 is a schematic drawing of a system which may be used to carry out the process of the present invention.

Referring now to the drawings, a system for carrying out the process of the present invention is indicated generally by the reference numeral 10. The system 10 may be of a type described in copending application S.N. 415,845 entitled "Process for Making Thin Flm Circuit Devices," filed Nov. 16, 1964, by Pierce et al., and assigned to the assignee of the present invention, wherein a glow discharge is established in a low pressure, inert gas atmosphere in order to clean the surface of exposed metals and polymerize a photo-resist insulating layer by irradiation with the ionized gas atoms. Thus the system 10 may have a vacuum chamber 12 comprised of a base 14 and a bell jar 16. A vacuum system 18 is provided to evacuate the chamber, preferably to pressures as low as $10^{-7}$ millimeters of mercury, and should preferably have adequate traps and filter means for maintaining the atmosphere within the chamber as pure and controlled as possible. A source 20 of an inert gas, such as argon, is provided to fill the chamber as required for the glow discharge. A pair of electrodes 22 are connected to a variable voltage A.C. source 24 to establish the glow discharge. A suitable mechanism (not illustrated) is provided for supporting a substrate 26 in position #1, illustrated in dotted outline, and position #2, illustrated in solid outline, without breaking the vacuum in the chamber 12. A suitable vacuum evaporation and condensation system for coating the substrate 26 when in position #2 with either of two metals is represented by a chimney 28. Within the chimney 28 are vessels (not illustrated) and means for selectively heating and evaporating a tin-indium alloy, and also pure lead and pure tin. The evaporated metal propagates upwardly through the chimney and nucleates on the surface of the substrate to form a metal film as will presently be described. The chimney 28 prevents excessive deposits of metal on the interior surface of the bell jar 16 and other equipment within the vacuum chamber since the evaporated metal tends to travel in a straight line.

Figure 2:
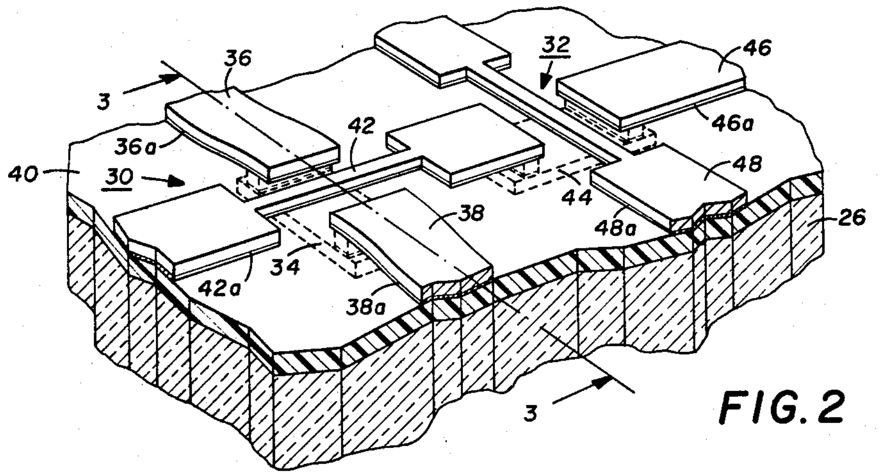
FIGURE 2 is an enlarged perspective view, somewhat schematic, of a thin film cryogenic circuit which may be fabricated using the process of the present invention; and, FIGURE 3 is a sectional view taken substantially on line 3—3 of FIGURE 2.
Figure 3:
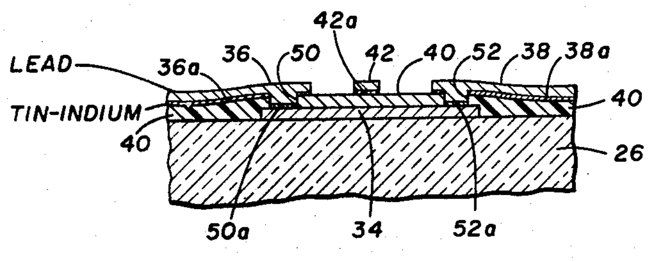

A portion of a typical cryogenic circuit which may be fabricated using the process of the present invention is illustrated in FIGURE 2. The substrate 26 upon which the circuit is formed may conveniently comprise a sheet of glass approximately two inches square. As illustrated, the circuit includes two cryotrons indicated generally by the reference numerals 30 and 32. The cryotron 30 has a carrier conductor comprised of a tin gate strip 34 and lead strips 36 and 38. The lead strips 36 and 38 pass through windows 50 and 52 in a polymer insulating film 40 and contact the tin gate strip 34 as illustrated in FIGURE 3. A lead control strip 42 passes over the tin gate strip 34 and is insulated from the gate strip by the insulating layer 40. The cryotron 32 is of the same construction and has a carrier conductor comprised of a tin gate strip 44, and lead strips 42 and 46. A control conductor 48 passes over the tin gate strip 44 and is electrically insulated from the gate strip by the insulating film 40.

In accordance with the present invention, each of the lead strips is more adherently bonded to the underlying substrate, or to the underlying insulating layer as the case may be, by a metal alloy having a critical temperature approaching the critical temperature of the lead. More specifically, the lead strips are bonded to the underlying substrate by a very thin film of a tin-indium alloy in proportions which will hereafter be described in greater detail. Although the process and structure of the present invention can be conveniently understood by reference to the circuit of FIGURE 2, it is to be understood that the invention is not limited to the particular circuit or circuit construction illustrated.

When constructing the circuit of FIGURE 2 in accordance with the present invention, the substrate 26 is thoroughly cleaned, then placed in the vacuum chamber 12 and the chamber evacuated. If desired, the substrate may be subjected to a glow discharge as described in the above referenced application to facilitate cleaning, although this is not particularly necessary. The substrate 26 is then positioned over the chimney 28 and a film of tin evaporated onto the surface. The tin adheres to the substrate and other components of the circuit without an additional bonding layer. The substrate 26 is then removed from the vacuum system and the tin film coated with a conventional photo-resist material which is then exposed in preselected areas and developed by conventional techniques to expose those areas of the tin film which are to be removed, and protect those areas which are to be retained to form the tin gate strips 34 and 44. The substrate is then immersed in a suitable conventional selective etchant such as dilute nitric acid to remove the tin film in the areas not protected by the photo-resist to form the tin gate strips 34 and 44.

The remaining portion of the photo-resist may then be stripped from the substrate, if required, and the substrate, including the tin gate strips 34 and 44, coated with new photoresist material to form the insulating layer 40 which is then exposed and developed to form windows through which contact can be made with the tin gate strips 34 and 44. For example, the coat of photo-resist material 40 may be exposed and developed to form the windows 50 and 52 as illustrated in FIGURE 3.

The substrate 26 is then placed back in the vacuum chamber 12, the chamber evacuated, backfilled with argon, and a glow discharge established to fix the insulating layer 40 and thoroughly clean the surfaces of the tin strips 34 and 44 exposed through the windows as described in the above referenced copending application S.N. 415,845. However, it is to be understood that the glow discharge step does not constitute a part of the process of the present invention.

In accordance with the present invention, the substrate 26 is then moved into position over the chimney 28 and a thin film of the tin-indium alloy evaporatively deposited over the entire surface of the substrate. A very thin film is sufficient since its only function is to improve the adherence between a subsequently deposited metal film and the substrate. A film thickness of about 100 to about 500 angstroms has been found to be satisfactory. The tin-indium alloy film is preferably deposited on the substrate by evaporating an alloy comprised of approximately 50% tin and 50% indium. The evaporated alloy will then propagate through the vacuum generally in a line of sight and nucleate on the lower face of the substrate 26 to form the thin film in a conventional manner. Next, a thicker film of pure lead is evaporated and nucleated on the surface of the substrate 26 using the same technique, preferably without breaking the vacuum on the system so as to prevent contamination of the surface of the tin-indium alloy film.

The substrate 26 is then removed from the chamber 12 and the films of lead and tin-indium alloy patterned by conventional techniques. This may be accomplished by applying a coat of photo-resist over the substrate, exposing and developing the photo-resist to uncover those areas of the lead and tin-indium alloy films which must be removed to form the various conductors 36, 38, 42, 46 and 48, and then immersing the substrate in an etchant such as nitric acid to remove both the lead film and the tin-indium alloy film in the unprotected areas. An important advantage of the invention is that the alloy film can be etched by nitric acid which is the best etchant for lead.

In the resulting structure, the lead conductors 36, 38, 42, 46 and 48 are similarly bonded to the insulating layer 40 by thin films of tin-indium alloy **36*a*, 38*a*, 42*a*, 46*a* and 48*a*, respectively. Thin films 50*a* and 52*a* of tin-indium alloy are also disposed between the tin gate strip 34 and the lead conductors 36 and 38, respectively, and similar tin-indium alloy films are disposed between the lead conductors 42 and 46 and the tin gate strip 44, although not illustrated. Although tin has a critical temperature of approximately 3.7° K. and indium has a critical temperature of approximately 3.4° K., a tin-indium alloy having from about 30%–70% to about 70%–30% tin to indium content has a critical temperature of about 6.3° K. Thus the superconductivity of the lead is not adversely affected even though disposed in intimate contact with the tin-indium alloy, because the critical temperature of the alloy approaches that of lead, which is about 7.0° K. Further, the tin-indium alloy films 50*a* and 52*a*** extending transversely across each of the superconductors do not materially affect the superconductivity of these conductors because of the high critical temperature of the tin-indium alloy film and also because the alloy films are very thin.

The tin-indium alloy is particularly suited for the application described above because it significantly improves the bond between the lead films and both the substrate 26 and insulating layer 40. Further, the tin-indium alloy has a relatively high critical temperature which remains substantially constant over a wide range of tin-to-indium ratios. Therefore, the percent of tin in the alloy may vary from about 30% to about 70%, with the remainder of the alloy being indium. For purposes of this disclosure and the appended claims, the above percentages are expressed in weight, but corresponding atomic percentages or volume percentages would not be significantly different as to exceed the intended limits of the invention, the limits of the proportions being dictated by the drop in the critical temperature of the alloy outside the general 30%–70% tin range. This wide range of proportions simplifies the control required in the evaporation-deposition of the alloys, but a 50% tin–50% indium alloy is preferred in order to allow for any variations in percentages which might result in a particular deposition system.

While the nature of the cryogenic structures herein described do not readily admit to specific measurement of the increased bond between the metal conductive films and the substrate and insulating layers afforded by the tin-indium alloy, it may generally be stated that the yield of good cryogenic circuits was significantly increased using the process of the present invention, and the ability of the circuits to withstand repeated temperature cycling was increased. The tin-indium is particularly suited because of the low temperature and simple system required to evaporate and deposit the alloy on the substrate, the improved adherence between the lead films and the substrate materials, and the high critical temperature of the tin-indium alloy.

As used in the appended claims, the term substrate shall be construed in its broader sense to include any structure upon which a film may be deposited, including for example, the glass substrate 26 and the insulating layer 40.

Although a specific embodiment of the invention has been described in detail, it is to be understood that various changes, substitutions and alterations can be made therein without departing from the spirit and scope of the invention as defined by the appended claims.

What is claimed is:

1. The process for adherently bonding a superconductive film to a substrate which comprises:

positioning the substrate in a vacuum chamber and substantially evacuating the chamber, evaporating an alloy comprised of from about thirty percent (30%) to about seventy percent (70%) tin (Sn) and the remainder indium (In) onto a surface of the substrate to form a thin film of the alloy over a surface of the substrate, and evaporating a superconductive metal onto the surface of the alloy film to form a film of superconductive lead metal over the alloy film.

2. In a process for fabricating a thin film cryogenic circuit, the steps of:

positioning a substrate in a vacuum chamber and substantially evacuating the chamber, evaporating an alloy comprising from about 30 percent (30%) to about 70 percent (70%) tin (Sn) and the remainder indium (In) onto a surface of the substrate to form a film of the alloy from about 100 to about 500 angstroms thick, and evaporating lead (Pb) onto the surface of the alloy film.

References Cited

UNITED STATES PATENTS

| | | | |
|---|---|---|---|
| 3,085,913 | 4/1963 | Caswell | 117—107 |
| 3,113,889 | 12/1963 | Cooper et al. | 117—217 |
| 3,121,852 | 2/1964 | Boyd et al. | 338—19 |
| 3,205,555 | 9/1965 | Balde et al. | 29—25.42 |
| 3,288,637 | 11/1966 | Ames | 117—212 |

JACOB H. STEINBERG, *Primary Examiner.*